(12) United States Patent
Gomez et al.

(10) Patent No.: US 7,795,145 B2
(45) Date of Patent: Sep. 14, 2010

(54) PATTERNING CRYSTALLINE COMPOUNDS ON SURFACES

(75) Inventors: Marcos Gomez, Santa Barbara, CA (US); Peter Erk, Frankenthal (DE); Frauke Richter, Mannheim (DE); Zhenan Bao, Stanford, CA (US); Shuhong Liu, Stanford, CA (US)

(73) Assignees: BASF Aktiengesellschaft, Ludwigshafen (DE); The Board of Trustees of the Leland Stanford Junior University, Palo Alto, CA (US)

( * ) Notice: Subject to any disclaimer, the term of this patent is extended or adjusted under 35 U.S.C. 154(b) by 781 days.

(21) Appl. No.: 11/353,934

(22) Filed: Feb. 15, 2006

(65) Prior Publication Data

US 2007/0190783 A1   Aug. 16, 2007

(51) Int. Cl.
*H01L 21/44* (2006.01)
(52) U.S. Cl. .................... 438/687; 257/E29.003
(58) Field of Classification Search .......... 438/687; 257/E29.003
See application file for complete search history.

(56) References Cited

U.S. PATENT DOCUMENTS

| | | | |
|---|---|---|---|
| 5,512,131 A * | 4/1996 | Kumar et al. ............... | 438/738 |
| 6,828,582 B1 | 12/2004 | Ando et al. | |
| 6,887,332 B1 | 5/2005 | Kagan et al. | |
| 2004/0061104 A1 | 4/2004 | Bao et al. | |
| 2005/0025880 A1* | 2/2005 | Masuda ....................... | 427/58 |
| 2006/0014365 A1 | 1/2006 | Kugler et al. | |

FOREIGN PATENT DOCUMENTS

| | | |
|---|---|---|
| WO | WO 01/47044 | 6/2001 |
| WO | WO 2004/114371 A2 | 12/2004 |
| WO | WO 2005/001952 A1 | 1/2005 |

OTHER PUBLICATIONS

U.S. Appl. No. 11/744,611, filed May 4, 2007, Koenemann, et al.
U.S. Appl. No. 11/835,006, filed Aug. 7, 2007, Koenemann, et al.

(Continued)

*Primary Examiner*—Matthew Smith
*Assistant Examiner*—Walter H Swanson
(74) *Attorney, Agent, or Firm*—Oblon, Spivak, McClelland, Maier & Neustadt, L.L.P.

(57) ABSTRACT

A method of patterning the surface of a substrate with at least one organic semiconducting compound including:
(a) providing a stamp having a surface including a plurality of indentations formed therein defining an indentation pattern contiguous with a stamping surface and defining a stamping pattern,
(b) coating the stamping surface with at least one compound (C1) capable of binding to the surface of the substrate and at least one organic semiconducting compound (S),
(c) contacting at least a portion of the surface of a substrate with the stamping surface to allow deposition of the compound (C1) on the substrate,
(d) removing the stamping surface to provide a pattern of binding sites on the surface of the substrate,
(e) applying a plurality of crystallites of the organic semiconducting compound (S) to the surface of the substrate to bind at least a portion of the applied crystallites to the binding sites on the surface of the substrate.

44 Claims, 8 Drawing Sheets

OTHER PUBLICATIONS

Benjamin R. Martin, et al., "Self-Alignment of Patterned Wafers Using Capillary Forces at a Water-Air Interface", Adv. Funct. Mater., vol. 11, No. 5, Oct. 2001, pp. 381-386.

Fengqiu Fan, "Assembly of Colloidal Particles by Evaporation on Surfaces with Patterned Hydrophobicity", Langmuir, vol. 20, No. 8, 2004, pp. 3062-3067.

Yue Zhao, et al., "Positioning and Alignment of Lipid Tubules on Patterned Au Substrates", Langmuir, 2006, 5 pages.

Briseno A.L. et al., "Patterning ORganic Single-Crystal Transistor Arrays," Nature, Nature Publishing Group, vol. 444, Dec. 14, 2006, pp. 913-917 (XP007902213).

Xia Y, et al., "Soft Lithography," Annual Review of Materials Science, Annual Reviews, Inc., vol. 28, 1998, pp. 153-184 (XP009023786).

Xia Y, et al., "Soft Lithography," Angewandte Chemie, International Edition, Wiley VCH Verlag, Weinheim, DE, vol. 37, (1998), pp. 551-575 (XP000985399).

U.S. Appl. No. 11/417,149, filed May 4, 2006, Koenemann, et al.
U.S. Appl. No. 11/435,886, filed May 18, 2006, Bao, et al.
U.S. Appl. No. 11/480,879, filed Jul. 6, 2006, Bao, et al.
U.S. Appl. No. 11/502,544, filed Aug. 11, 2006, Bao, et al.
U.S. Appl. No. 12/666,127, filed Dec. 22, 2009, Koenemann, et al.

* cited by examiner

PATTERNING CRYSTALLINE COMPOUNDS ON SURFACES

BACKGROUND OF THE INVENTION

1. Field of the Invention

The present invention relates to a method of patterning the surface of a substrate with at least one crystalline compound.

2. Description of the Related Art

In the field of microelectronics there is a constant need to develop smaller device elements that can be reproduced conveniently and inexpensively with a lowest possible failure rate. Modern digital integrated circuits are based on field-effect transistors (FET), which rely on an electric field to control the conductivity of a "channel" in a semiconductor material. Organic field-effect transistors (OFET) allow the production of flexible or unbreakable substrates for integrated circuits having large active areas. As OFETs enable the production of complex circuits they have a wide area of potential application (e.g. in driver circuits of pixel displays).

Lithographic techniques for the manufacture of integrated circuits (IC) are well known in the art. However, the smaller the device, the more difficult it is to manufacture and, thus, the more expensive it becomes. Moreover, in the production of semiconductors on a molecular scale, lithographic approaches may fail owing to lithographic constraints imposed by resolution and alignment. It is therefore desirable to produce ICs by techniques which use a driving force that causes atoms to assemble in the desired fashion (self-assembling of electronic circuitry).

Different methods for the self-assembly of micro-objects onto substrates are known. A first technique is the fluidic self-assembly, wherein the device units or "blocks" are shaped to match receptor sites or "holes" that have been etched into the substrate. The blocks are suspended in a carrier liquid that is dispensed over the substrate. The blocks fall towards the receptor sites and, with the assistance of fluid flow and/or acoustic vibration, self-orient into the holes or are removed from the substrate to be recirculated. The driving force behind this assembly process is gravity. Development of the fluidic self-assembly is based on capillary force. Benjamin R. Martin, Donna C. Furnange, Thomas N. Jackson, Thomas E. Mallouk, and Theresa S. Mayer describe in Adv. Funct. Mater. 2001, 11, 381-386, the self-alignment of patterned wafers using capillary forces at a water-air interface. Those capillary interactions were used to align glass wafers with silicon-wafers. A silica surface was patterned with gold millimeter-scale borders enclosing micrometer-scale gold alignment marks in the center. The gold portions of the pattern were rendered hydrophobic with a self-assembled monolayer formed from long-chain alkanthiols. Water dropped on the surface selectively wetted the hydrophilic silica regions defined by the pattern. These confined droplets drove the alignment when two wafers with complementary hydrophobic/hydrophilic patterns were pressed together.

A further self-assembly technique makes use of patterned surfaces. Fengqiu Fan and Kathleen J. Stebe describe in Langmuir, 2004, 20, 3062-3067, the assembly of colloidal particles by evaporation on surfaces with patterned hydrophobicity. To obtain chemical modifications the surface of an Au-coated silicon wafer substrate was patterned into hydrophobic/hydrophilic regions using microcontact printing. To prepare hydrophilic self-assembled monolayers (SAM) a solution of $HS(CH_2)_{15}COOH$ was brought into contact with the gold surface using a poly(dimethylsiloxane) (PDMS) stamp. Subsequently, the substrates were immersed in a solution of $HS(CH_2)_{17}CH_3$ to cover the remainder of the surface with a hydrophobic SAM. Colloidal polystyrene particles, optionally functionalized with positively charged amidine groups or negatively charged sulfate groups, were dispersed into water; drops containing the suspended particles were then placed on the surface of the substrate to study their adsorption behaviour.

U.S. Pat. No. 6,887,332 B1 teaches a method for forming a thin film on a surface of a substrate having thereon a patterned underlayer of a self-assembled monolayer. The underlayer is prepared by coating the surface with an organic molecular species having head functional groups capable of interacting with the surface of the substrate and tail functional groups for chemical differentiation of patterned and unpatterned regions of the coated surface by microstamping. The thin film is deposited on the underlayer by a solution-based charges. Micro-objects that are also functionalized with charge through surface modification can be patterned into selected regions through electrostatic interactions.

A further self-assembly technique makes use of patterned topography. Description: The key strategy of this process is the dewetting of a colloid dispersion on a substrate that has been patterned with an array of templates (such as cylindrical holes). When this dispersion is allowed to dewet slowly, the capillary force leads to an assembly of the colloidal particles in the templates.

A further self-assembly technique makes use of the patterning of objects through applied electric or magnetic fields. The electrical or magnetic contacts of the substrates were prefabricated. By adding an external electric or magnetic field, objects could be aligned or placed in certain region on the substrates.

According to the microfluidic self-assembly technique, solutions containing 1-D objects can fill the microchannels via capillary action or liquid flow. Upon evaporation of the solvent or during liquid flow, the objects can be aligned onto substrates.

U.S. Pat. No. 6,828,582 B1 describes a thin film transistor comprising a gate electrode, a gate insulation film, a source electrode, a drain electrode, a semiconductor film and a protection film, stacked on a substrate, wherein the semiconductor film is composed of an aggregate of organic semiconductor molecules, and the organic semiconductor molecules of the semiconductor film formed in a gate electrode-projected region on a surface of the insulation film have a higher orientation order than that of the semiconductor film formed outside the region. The organic semiconductor film is formed by selectively disposing a self-assembled monolayer film on the surface of the insulation film and then forming the semiconductor film thereon by making use of the orientation order of the self assembled monolayer of the insulation film. A water-repellent monolayer film having a carbon chain partly terminated with a fluorine or hydrogen atom is used as the self-assembled monolayer film.

WO 2004/114371 A2 discloses a compound used to form a self-assembled monolayer, especially for a semiconductor component, being characterised by a molecular group capable of π-π interaction with other similar compounds and/or other different compounds for the stabilisation of the monolayer.

WO 2005/001952 A1 discloses a compound for forming a self-organizing monolayer, particularly for forming a layer structure for an organic field effect transistor, characterized by: a) at least one anchor group for binding the molecule to a substrate, particularly an electrode material; b) at least one dielectric group, and; c) at least one semiconducting group. Y. Zhao and J. Fang describe in Langmuir, 2006 (published in the internet) a method for positioning and aligning self-assembled tubules of 1,2-bis(tricosa-10,12-diynoyl)-syn-glycero-3-phosphocholine by withdrawing a patterned Au substrate from a lipid tubule solution.

U.S. 2004/0061104 A1 discloses a method for making an integrated circuit (IC) in which organic semiconductor crystallites function as active channels of organic semiconductor devices. The method includes providing a substrate with a surface that has a preselected pattern of adhesion sites located thereon and capable of adhering crystallites of an organic semiconductor. This document does not teach the use of microcontact printing ("stamping") to form a semiconductor pattern on the surface of the substrate.

The patterning methods according to the prior art show at least one of the following disadvantages:
- high cost (e.g. fluidic self-assembly techniques needs lithography or etching to make substrate patterns)
- low throughput (especially substrate topography-templated assembly is a slow process)
- complexity (e.g. patterning by applied electric or magnetic fields)
- no general applicability (e.g. high demands on surface properties of micro-objects; e.g.: fluidic assembly, electrostatic self-assembly, etc. Generally, it is problematic to functionalize organic single crystals without changing their properties).
- little control on inter-object spacing and/or on object orientation (especially by self-assembly through electrostatic forces)

SUMMARY OF THE INVENTION

In a first aspect, the invention provides a method of patterning the surface of a substrate with at least one crystalline compound, comprising the step of depositing on the surface of the substrate at least one compound (C1) capable of binding to the surface of the substrate and of binding at least one crystalline compound and/or at least one compound (C2) capable of binding to the surface of the substrate and to prevent binding of a crystalline compound.

A first embodiment is a method of patterning the surface of a substrate with at least one crystalline compound, comprising the steps of:
(a) providing a stamp having a surface including a plurality of indentations formed therein defining an indentation pattern, said indentations being contiguous with a stamping surface and defining a stamping pattern,
(b) coating said stamping surface with at least one compound (C1) capable of binding to the surface of the substrate and of binding at least one crystalline compound,
(c) contacting at least a portion of the surface of a substrate with said stamping surface to allow deposition of said compound (C1) on the substrate,
(d) removing said stamping surface to provide a pattern of binding sites on the surface of the substrate,
(e) applying a crystalline compound to the surface of the substrate to enable at least a portion of the applied crystals to bind to at least a portion of the binding sites on the surface of the substrate.

A second embodiment is a method of patterning the surface of a substrate with at least one crystalline compound, comprising the steps of:
(a) providing a stamp having a surface including a plurality of indentations formed therein defining an indentation pattern, said indentations being contiguous with a stamping surface and defining a stamping pattern,
(b) coating said stamping surface with at least one compound (C2) capable of binding to the surface of the substrate and to prevent binding of a crystalline compound,
(c) contacting at least a portion of the surface of a substrate with said stamping surface to allow deposition of said compound (C2) on the substrate,
(d) removing said stamping surface to provide a pattern of sites on the surface of the substrate that prevent binding of a crystalline compound,
(e) applying a crystalline compound to the surface of the substrate to enable at least a portion of the applied crystals to bind to at least a portion of the surface of the substrate not covered with (C2).

The free surface areas of the substrate obtained in step (d) can be left unmodified or be coated, e.g. with at least one compound (C1) capable of binding to the surface of the substrate and of binding at least one crystalline compound, In a further aspect the invention provides a method for producing a substrate comprising a pattern of organic field effect transistors, each transistor comprising:
- a crystallite of an organic semiconductor (S) located on the substrate;
- a gate structure positioned to control the conductivity of a channel portion of the crystallite; and
- conductive source and drain electrodes located at opposite ends of the channel portion, wherein the positioning of the crystallites comprises the steps of:
(a) providing a stamp having a surface including a plurality of indentations formed therein defining an indentation pattern, said indentations being contiguous with a stamping surface and defining a stamping pattern,
(b) coating said stamping surface with at least one compound (C1) capable of binding to the surface of the substrate and of binding at least one organic semiconducting compound (S),
(c) contacting at least a portion of the surface of a substrate with said stamping surface to allow deposition of said compound (C1) on the substrate,
(d) removing said stamping surface to provide a pattern of binding sites on the surface of the substrate,
(e) applying a plurality of crystallites of the organic semiconducting compound (S) to the surface of the substrate to enable at least a portion of the applied crystallites to bind to at least a portion of the binding sites on the surface of the substrate.

In a second embodiment the positioning of the crystallites comprises the steps of:
(a) providing a stamp having a surface including a plurality of indentations formed therein defining an indentation pattern, said indentations being contiguous with a stamping surface and defining a stamping pattern,
(b) coating said stamping surface with at least one compound (C2) capable of binding to the surface of the substrate and to prevent binding of at least one organic semiconducting compound (S),
(c) contacting at least a portion of the surface of a substrate with said stamping surface to allow deposition of said compound (C2) on the substrate,
(d) removing said stamping surface to provide a pattern of sites on the surface of the substrate that prevent binding of a crystalline compound,
(e) applying a plurality of crystallites of the organic semiconducting compound (S) to the surface of the substrate to enable at least a portion of the applied crystallites to bind to at least a portion of the surface of the substrate not covered with (C2). The free surface areas of the substrate obtained in step (d) can be left unmodified or be coated, e.g. with at least one compound (C1) capable of binding to the surface of the substrate and of binding at least one crystalline compound,

DETAILED DESCRIPTION OF PREFERRED EMBODIMENTS OF THE INVENTION

Figure 1:
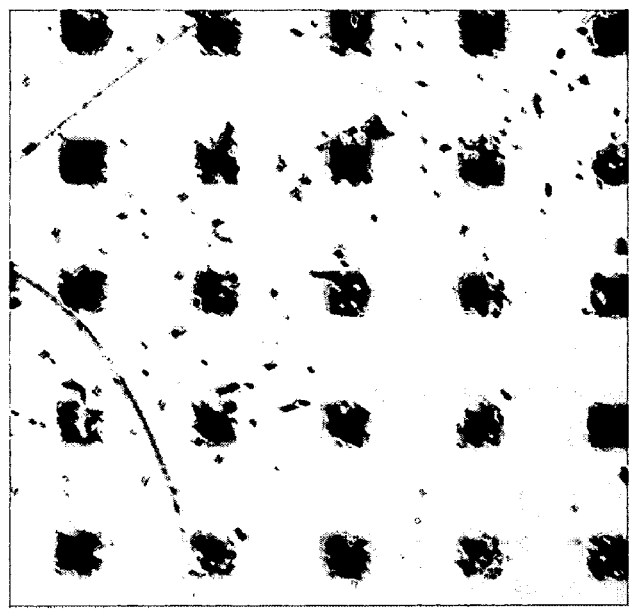
FIG. 1 shows copper phthalocyanine (CuPc) crystals on an Au substrate patterned with hexdecane thiol; crystals are applied using water as the suspension medium.

For the purpose of the present application, the term "binding" is understood in a broad sense. This covers every kind of binding interaction between a compound (C1) and/or a compound (C2) and the surface of the substrate and every kind of binding interaction between a compound (C1) and a crystalline compound, respectively. The types of binding interaction include the formation of chemical bonds (covalent bonds), ionic bonds, coordinative interactions, van der Waals interactions (e.g. dipole dipole interactions), etc. and combinations thereof. In one preferred embodiment, at least one of the binding interactions between the compound (C1), the surface of the substrate and the crystalline compounds is an adhesive interaction.

Suitable compounds (C2) are compounds with a lower affinity to the crystalline compounds than the untreated substrate or, if present, (C1). If a substrate is only coated with at least one compound (C1) it is of critical importance that the strength of the binding interaction of (C2) and of the substrate with the crystalline compound differs to a sufficient degree so that the crystalline compound is essentially deposited on substrate areas not patterned with (C2). If a substrate is coated with at least one compound (C1) and at least one compound (C2) it is of critical importance that the strength of the binding interaction of (C1) and (C2) with the crystalline compound differs to a sufficient degree so that the crystalline compound is essentially deposited on substrate areas patterned with (C1). In a preferred embodiment the interaction between (C2) and the crystalline compound is a repulsive interaction. For the purpose of the present application, the term "repulsive interaction" is understood in a broad sense and covers every kind of interaction that prevents deposition of the crystalline compound on areas of the substrate patterned with compound (C2).

A wide variety of crystalline compounds are suitable for use in the present invention. In principal any electrically conductive, electrically nonconductive or electrically semiconductive material, forming a solid crystalline phase at room temperatur may be employed. Preferably, crystallites of at least one organic semiconducting compound (S) are used as the crystalline compound.

Accordingly, the present invention provides a method for patterning the surface of a substrate with at least one organic semiconducting compound using at least one self-assembly step. The method includes providing a substrate with a surface that has a preselected pattern of binding sites located thereon. The binding sites are capable of binding to crystallites of the semiconductor compound (S).

Thus, the present invention provides a method which causes previously prepared crystallites to assemble themselves into microelectronic devices by "self-assembly". By preparing a preselected pattern of adhesion sites via microprinting, the method is able to produce a fine pattern of devices, especially OFETs, on a substrate, wherein the devices' active channels are preformed crystallites. Advantageously, in the method of the invention a suspension of solid semiconductor particles in a liquid medium can be used for the application of the crystallites of the organic semiconductor (S) to the surface of the substrate. The driving force behind the self-assembly of the crystallites on the substrate, such as the local binding interaction of molecules with each other and the surface of the substrate, is at an atomic scale. Using the method of the invention, there is no need to use a lithographic process for the positioning of OFETs on an organic semiconductor device. Further, there is no need to use a microprint technique to apply the semiconductor crystallites to the substrate. The process of the invention also preferably does not make use of external driving forces or fields, e.g. DC fields, AC fields, magnetic fields, etc.

A further aspect of the present invention relates to a substrate having an array of OFETs. Each OFET includes an isolated crystallite of an organic semiconductor, a gate structure, and conductive source and drain electrodes located at opposite ends of a channel portion of the crystallite. The crystallite is located on the substrate and is not connected to a crystallite of another transistor by a continuous pathway of crystallite material, i.e. the crystallites of different OFETs are isolated from each other. The gate structures are positioned to control the conductivities of the channel portions of the crystallites.

The process according to the invention has the following advantages:

a) This method can be generally used for patterning objects of different materials irrespective of their size, surface properties, and morphologies.
b) This method enables high throughput, as the key steps (stamping and spin-coating or dip coating) are high throughput processes.
c) This method is simple and cost-effective (no complicated design is required and valuable crystal suspensions can be reused).
d) This method allows high yields as it allows patterns that can be covered with crystals up to 100%.
e) Potential control of crystal orientation (e.g. by choosing patterns with appropriate shapes, crystals with appropriate dimensions and/or by control of the flow direction of the crystallite suspension) crystal alignment might be realized.
f) This method enables a reduction of pollution as water or liquid mediums containing a major amount of water can be used for dispersing the crystals.

Any material that allows patterning of its surface with at least one compound (C1) can be used as the substrate. Preferred substrates are selected from materials suitable for the production of semiconductor devices. Suitable substrates include, for example, metals (preferably metals of groups 8, 9, 10 or 11 of the periodic table, e.g. Au, Ag, Cu), oxidic materials (like glass, quartz, ceramics, $SiO_2$), semiconductors (e.g. doped Si, doped Ge), metal alloys (e.g. on the basis of Au, Ag, Cu, etc.), semiconductor alloys, polymers (e.g. polyvinylchloride, polyolefines, like polyethylene and polypropylene, polyesters, fluoropolymers, polyamides, polyurethanes, polyalkyl(meth)acrylates, polystyrene and mixtures and composites thereof), inorganic solids (e.g. ammonium chloride), and combinations thereof. The substrate can be a flexible or inflexible solid substrate with a curved or planar geometry, depending on the requirements of the desired application.

A typical substrate for semiconductor devices comprises a matrix (e.g. quartz or polymer matrix) and, optionally, a dielectric top layer (e.g. $SiO_2$). The substrate also generally includes electrodes, like the drain and source electrodes of the OFETs, which are usually located on the substrate (e.g. deposited on the nonconductive surface of the dielectric top layer). The substrate also includes conductive gate electrodes of the OFETs that are typically located below the dielectric top layer (i.e., the gate dielectric). According to a special embodiment, the drain and source electrodes are deposited partially on the organic semiconductor crystallite rather than only on the substrate. Of course, the substrate can contain further components that are usually employed in semiconductor devices or ICs, such as insulators, resistive structures, capacitive structures, metal tracks, etc.

The compound (C1) usually comprises at least one functional group capable of interaction with the surface of the substrate and also at least one functional group capable of interaction with the semiconductor compound. The functional groups capable of interaction with the surface of the substrate can be the same as the functional groups capable of interaction with the semiconducting compound. Alternatively, the compound (C1) can comprise two different species of functional groups, one for the interaction with the substrate and the other for the interaction with (S).

In the following, the term "hydrocarbon group" comprises alkyl groups, cycloalkyl groups, heterocycloalkyl groups, aryl groups, heteroaryl groups and combinations thereof.

In the following, the expression "alkyl" comprises straight-chain and branched alkyl groups. These groups are preferably straight-chain or branched $C_1$-$C_{20}$-alkyl groups, more preferably $C_1$-$C_{12}$-alkyl groups, particularly preferably $C_1$-$C_8$-alkyl groups and most preferably $C_1$-$C_4$-alkyl groups. Examples of alkyl groups are, in particular, methyl, ethyl, propyl, isopropyl, n-butyl, 2-butyl, sec-butyl, tert-butyl, n-pentyl, 2-pentyl, 2-methylbutyl, 3-methylbutyl, 1,2-dimethylpropyl, 1,1-dimethylpropyl, 2,2-dimethylpropyl, 1-ethylpropyl, n-hexyl, 2-hexyl, 2-methylpentyl, 3-methylpentyl, 4-methylpentyl, 1,2-dimethylbutyl, 1,3-dimethylbutyl, 2,3-dimethylbutyl, 1,1-dimethylbutyl, 2,2-dimethylbutyl, 3,3-dimethylbutyl, 1,1,2-trimethylpropyl, 1,2,2-trimethylpropyl, 1-ethylbutyl, 2-ethylbutyl, 1-ethyl-2-methylpropyl, n-heptyl, 2-heptyl, 3-heptyl, 2-ethylpentyl, 1-propylbutyl. n-octyl, 2-ethylhexyl, 2-propylheptyl, nonyl, decyl. Suitable longer-chain $C_8$-$C_{30}$-alkyl or $C_8$-$C_{30}$-alkenyl groups are straight-chain and branched alkyl or alkenyl groups. octyl(ene), nonyl(ene), decyl(ene), undecyl(ene), dodecyl(ene), tridecyl(ene), tetradecyl(ene), pentadecyl(ene), hexadecyl(ene), heptadecyl(ene), octadecyl(ene) and nonadecyl(ene) etc.

The expressions "alkyl" and "alkylene" also comprise substituted alkyl groups which can generally bear 1, 2, 3, 4 or 5 substituents, preferably 1, 2 or 3 substituents and particularly preferably 1 substituent, selected from among cycloalkyl, aryl, hetaryl, halogen, hydroxy, thiol, $NE^1E^2$, $NE^1E^2E^{3+}$, COOH, carboxylate, —$SO_3H$ and sulfonate.

"Cycloalkyl" is preferably $C_5$-$C_8$-cycloalkyl, such as cyclopentyl, cyclohexyl, cycloheptyl or cyclooctyl.

For the purposes of the present invention, the term "heterocycloalkyl" includes saturated, cycloaliphatic groups with in general 4 to 7, preferably 5 or 6, ring atoms in which 1 or 2 of the ring carbon atoms are replaced by heteroatoms chosen from the elements oxygen, nitrogen and sulfur and which may optionally be substituted where, as in the case of a substitution, these heterocycloaliphatic groups may carry 1, 2 or 3, preferably 1 or 2, particularly preferably 1, substituent chosen from alkyl, aryl, $COOR^a$, COO-$M^+$ and $NE^1E^2$, preferably alkyl.

Examples of heterocycloaliphatic groups which may be mentioned are pyrrolidinyl, piperidinyl, 2,2,6,6-tetramethylpiperidinyl, imidazolidinyl, pyrazolidinyl, oxazolidinyl, morpholidinyl, thiazolidinyl, isothiazolidinyl, isoxazolidinyl, piperazinyl, tetrahydrothiophenyl, tetrahydrofuranyl, tetrahydropyranyl and dioxanyl.

"Aryl" includes unsubstituted and substituted aryl groups and is preferably phenyl, tolyl, xylyl, mesityl, naphthyl, fluorenyl, anthracenyl, phenanthrenyl, naphthacenyl and, in particular, phenyl, tolyl, xylyl or mesityl.

"Hetaryl" is preferably pyrrolyl, pyrazolyl, imidazolyl, indolyl, carbazolyl, pyridyl, quinolinyl, acridinyl, pyridazinyl, pyrimidinyl or pyrazinyl.

The groups $NE^1E^2$ are preferably N,N-dimethylamino, N,N-diethylamino, N,N-dipropylamino, N,N-diisopropylamino, N,N-di-n-butylamino, N,N-di-t-butylamino, N,N-dicyclohexylamino or N,N-diphenylamino.

Halogen is fluorine, chlorine, bromine or iodine.

In a first preferred embodiment, the compound (C1) is bound to the surface of the substrate and/or to the crystalline compound (in particular (S) via covalent interactions. According to this embodiment, the compound (C1) comprises at least one functional group, capable of reaction with a complementary functional group of the substrate and/or a crystalline compound. In the context of the present invention, "complementary functional groups" mean a pair of functional groups which are able to react with one another under the formation of a covalent bond. Preferably, the complementary functional groups react with one another in a condensation or addition reaction.

Suitable functional groups for covalent interactions are preferably selected from hydroxyl, primary and secondary amino, thiol, carboxylic acid, carboxylic ester, carboxamide, carboxylic anhydride, sulfonic acid, sulfonic ester, isocyanate, blocked isocyanate, urethane, urea, ether, and epoxy groups.

Examples of pairs suitable for reaction are, on the one hand, compounds having active hydrogen atoms, selected for example from compounds containing alcohol, primary and secondary amine, and thiol groups, and, on the other hand, compounds having groups reactive therewith, selected for example from carboxylic acid, carboxylic ester, carboxamide, carboxylic anhydride, isocyanate, urethane, urea, alcohol, ether and epoxy groups. Further examples of suitable pairs are compounds containing epoxy groups, on the one hand, and carboxylic acid groups, on the other. It is generally not critical which functional group of the pair carries the compound (C1) and which the substrate or the crystalline compound.

Table 1 exemplifies suitable pairs of complementary functional groups

TABLE 1

| complementary group R' | complementary functional groups |  |  |  |  |  |  |
|---|---|---|---|---|---|---|---|
|  | reactive group R |  |  |  |  |  |  |
|  | isocyanate | (meth)acrylate/ vinyl | —SH | —NH$_2$ | —OH | —CHO | epoxy |
| isocyanate | X* |  | X | X | X |  |  |
| (meth)acrylate |  |  | X | X | X |  |  |
| vinyl |  |  | X | X | X |  |  |
| —SH | X | X |  |  |  | X | X |
| —NH$_2$ | X | X |  |  |  | X | X |
| —OH | X | X |  |  |  |  | X |
| —COOH | X |  |  |  |  |  |  |
| epoxy |  |  | X | X | X |  |  |
| —CHO |  |  | X | X |  |  |  |

*in the presence of water

The resulting covalent bonds are preferably selected from ester bonds, amide bonds, sulfonamide bonds, imino bonds, amidino bonds, urethane bonds, urea bonds, thiourethane bonds, thiourea bonds, sulfide bonds, sulfonyl bonds, ether bonds and amino bonds.

Suitable functional groups are also radically polymerizable C=C double bonds, comprising, in addition to the aforementioned (meth)acrylate groups, also vinylether and vinylester groups.

In a second preferred embodiment the compound (C1) is bound to the surface of the substrate and/or to the crystalline compound (in particular (S)) via ionic interactions. According to this embodiment, the compound (C1) comprises at least one functional group capable of ionic interaction with the surface of the substrate and/or a compound (S).

In a third preferred embodiment the compound (C1) is bound to the surface of the substrate and/or to the crystalline compound (in particular (S)) via dipole interactions, e.g. van der Waals forces.

The interaction between (C1) and the substrate and/or between (C1) and the crystalline compound is preferably an attractive hydrophilic-hydrophilic interaction or attractive hydrophobic-hydrophobic interaction. Hydrophilic-hydrophilic interaction and hydrophobic-hydrophobic interaction can comprise, among other things, the formation of ion pairs or hydrogen bonds and may involve further van der Waals forces. Hydrophilicity or hydrophobicity is determined by affinity to water. Predominantly hydrophilic compounds or material surfaces have a high level of interaction with water and generally with other hydrophilic compounds or material surfaces, whereas predominantly hydrophobic compounds or materials are not wetted or only slightly wetted by water and aqueous liquids. A suitable measure for assessing the hydrophilic/hydrophobic properties of the surface of a substrate is the measurement of the contact angle of water on the respective surface. According to the general definition, a "hydrophobic surface" is a surface on which the contact angle of water is >90°. A "hydrophilic surface" is a surface on which the contact angle with water is <90°. Compounds or material surfaces modified with hydrophilic groups have a smaller contact angle than the unmodified compound or materials. Compounds or material surfaces modified with hydrophobic groups have a larger contact angle than the unmodified compounds or materials.

Suitable hydrophilic groups for the compounds (C1) (as well as (C2) and/or (S)) are those selected from ionogenic, ionic, and non-ionic hydrophilic groups. Ionogenic or ionic groups are preferably carboxylic acid groups, sulfonic acid groups, nitrogen-containing groups (amines), carboxylate groups, sulfonate groups, and/or quaternized or protonated nitrogen-containing groups. Suitable non-ionic hydrophilic groups are e.g. polyalkylene oxide groups. Suitable hydrophobic groups for the compounds (C1) (as well as (C2) and/or (S)) are those selected from the aforementioned hydrocarbon groups. These are preferably alkyl, alkenyl, cycloalkyl, or aryl radicals, which can be optionally substituted, e.g. by 1, 2, 3, 4, 5 or more than 5 fluorine atoms.

Further suitable functional groups of the compounds (C1) are also ligand groups, capable of coordinating metal ions that can form additional coordinative bonds to the substrate and/or (S). Functional groups suitable as ligands are e.g. carboxylic groups, hydroxyl groups, amino groups, SH groups, oxime groups, aldehyde groups, keto groups and heterocyclic groups like pyridine, chinoline, imidazole or oxazole.

In order to modify the surface of the substrate with a plethora of functional groups it can be activated with acids or bases. Further, the surface of the substrate can be activated by oxidation, irradiation with electron beams or by plasma treatment. Further, substances comprising functional groups can be applied to the surface of the substrate via chemical vapor deposition (CVD).

Suitable functional groups for interaction with the substrate include:

- silanes, phosphonic acids, carboxylic acids, and hydroxamic acids: Suitable compounds (C1) comprising a silane group are alkyltrichlorosilanes, such as n-(octadecyl)trichlorosilane (OTS); compounds with trialkoxysilane groups, e.g. trialkoxyaminoalkylsilanes like triethoxyaminopropylsilane and N[(3-triethoxysilyl)propyl]ethylendiamine; trialkoxyalkyl-3-glycidylethersilanes such as triethoxypropyl-3-glycidylethersilane; trialkoxyallylsilanes such as allyltrimethoxysilane; trialkoxy(isocyanatoalkyl)silanes; trialkoxysilyl(meth)acryloxyalkanes and trialkoxysilyl(meth)acrylamidoalkanes, such as 1-triethoxysilyl-3-acryloxypropan. (These groups are preferably employed to bind to metal oxide surfaces such as silicon dioxide, aluminium oxide, indium zinc oxide, indium tin oxide and nickel oxide.),
- amines, phosphines and sulfur containing functional groups, especially thiols: (These groups are preferably employed to bind to metal substrates such as gold, silver, palladium, platinum and copper and to semiconductor surfaces such as silicon and gallium arsenide.)

In a preferred embodiment, the compound (C1) is selected from $C_8$-$C_{30}$-alkylthiols and is in particular hexadecane thiol. These compounds enable the application of crystallites of organic semiconducting compounds (S) to the surface of more hydrophobic substrates, such as Au (water contact angle 65°) as well as more hydrophilic substrates such as $NH_4Cl$ (water contact angle 49°).

In a further preferred embodiment the compound (C1) is selected from mercaptocarboxylic acids, mercaptosulfonic acids and the alkali metal or ammonium salts thereof. Examples of these compounds are mercaptoacetic acid, 3-mercaptopropionic acid, mercaptosuccinic acid, 3-mercapto-1-propanesulfonic acid and the alkali metal or ammonium salts thereof, e.g. the sodium or potassium salts. These compounds are suiteable for a hydrophilization of the surface of more hydrophobic substrates.

In a further preferred embodiment the compound (C1) is selected from alkyltrichlorosilanes, and is in particular n-(octadecyl)trichlorosilane (OTS). These compounds enable the application of crystallites of organic semiconducting compounds (S) to the surface of more hydrophobic substrates, such as $SiO_2$ (water contact angle >100°).

Additionally to or as an alternative to deposition of said compound (C1) on the substrate, the substrate can be contacted with at least one compound (C2) capable of binding to the surface of the substrate as well as of interaction with the organic semiconducting compound (S) to prevent deposition of (S) on areas of the substrate not patterned with compound (C1).

According to a first embodiment, the compounds (C2) can be selected from the group of the aforementioned compounds (C1). Whether a particular compound acts as (C1) or as (C2) depends on the strength of interaction with the crystalline compound. It is of critical importance that the strength of the binding interaction of (C1) and (C2) with (S) differs to a sufficient degree so that (S) is essentially deposited on substrate areas patterned with (C1).

According to a further embodiment, the compounds (C2) are selected from compounds with a repulsive hydrophilic-hydrophobic interaction with (S). Suitable functional groups for repulsive interaction with certain compounds (S) are hydrocarbon groups and (partially or fully) halogenated hydrocarbon groups. The hydrocarbon or the halogenated hydrocarbon can be purely aliphatic or aromatic or can have a combination of aliphatic and aromatic groups. Halogenated hydrocarbons can bear one or more than one (e.g. 2,3,4,5 or more than 5) of the following halogen groups: fluorine, chlorine, bromine, iodine, or a combination thereof. Preferably, the partially or fully halogenated hydrocarbon is a partially or fully fluorinated hydrocarbon or a chlorofluorocarbon. The hydrocarbon or the halogenated hydrocarbon can optionally bear further substituents apart from halogen.

As mentioned before the invention provides in a first embodiment a method of patterning the surface of a substrate with at least one crystalline compound, comprising the step of depositing on the surface of the substrate at least one compound (C1) capable of binding to the surface of the substrate and of binding at least one crystalline compound. According to this embodiment, preferably at least 90 % by weight, more preferably at least 95% by weight, especially at least 99% by weight, of the crystalline compound bound to the surface of the substrate is bound to surface areas patterned with (C1) (and not to unpatterned areas of the substrate or, if present, areas of the substrate coated with (C2)).

The second embodiment is a method of patterning the surface of a substrate with at least one crystalline compound, comprising the step of depositing on the surface of the substrate at least one compound (C2) capable of binding to the surface of the substrate and to prevent binding of a crystalline compound. According to this embodiment, preferably at least 90 % by weight, more preferably at least 95% by weight, especially at least 99% by weight, of the crystalline compound bound to the surface of the substrate is bound to surface areas not patterned with (C2) (i.e. to unpatterned areas of the substrate or, if present, areas of the substrate coated with (C1)).

Useful organic semiconductor compounds (S) are in principle those known to the person skilled in the art. These include acenes such as anthracene, tetracene, pentacene, and substituted acenes. A preferred acene is rubrene (5,6,11,12-tetraphenylnaphthacene). Substituted acene compounds useful as organic semiconductors in the present invention preferably comprise at least one substituent selected from the group consisting of electron-donating substituents (for example, alkyl, alkoxy, ester, carboxylate or thioalkoxy), electron withdrawing substituents (for example halogen, nitro or cyano) and combinations thereof. Useful substituted pentacenes are e.g. 2,9-dialkylpentacenes and 2,10-dialkylpentacenes, wherein the alkyl group has from 1 to 12 carbons, 2,1 0-dialkoxypentacenes, and 1,4,8,11 -tetraalkoxypentacenes. Suitable substituted pentacenes are described in U.S. Published Appln. No. 2003/0100779, and U.S. Pat. No. 6,864,396. Examples of further useful organic semiconductors include perylenes, fullerenes, phthalocyanines, oligothiophenes, and substituted derivatives thereof. Suitable oligothiophenes are quaterthiophene, quinquethiophene, sexithiophene, α,ω-di($C_1$-$C_8$)-alkyloligothiophenes, such as α,ω-dihexylquaterthiophene, α,ω-dihexylquinquethiophene and α,ω-dihexylsexithiophene, poly(alkylthiophenes) such as poly(3-hexylthiophene), bis(dithienothiophene), anthradithiophene and dialkylanthradithiophenes such as dihexylanthradithiophene, phenylene-thiophene (P-T) oligomers and derivatives thereof, especially a,co-alkyl substituted phenylene-thiophene oligomers such as tert. butyl-P-T-T-P-tert. butyl oligomer. Examples of further useful organic semiconductors include polyacetylene, polythienylenevinylene, C60. Especially preferred are copper(II) phthalocyanine and rubrene.

For binding interaction with (C1) and/or repulsive interaction with (C2) the semiconductors (S) can be subjected to a reaction to introduce functional groups capable of such an interaction. Suitable functional groups for covalent, ionic bonds, van der Waals, coordinative and other interactions are the aforementioned groups of component (C2).

These groups can be introduced into the compounds (S) by e.g. reaction with functional groups of (S) that are capable of a condensation reaction or addition reaction and at least one compound selected from compounds that bear at least one functional group complementary to those groups of (S), wherein the compounds also bear at least one functional group capable of interacting with (C1) and/or (C2). In many cases it is not necessary to subject the semiconductors (S) to a functionalization, as compounds (C1) and, optionally, (C2) capable of interacting with the surface of the substrate and (S) are readily available. So e.g. the aforementioned $C_8$-$C_{30}$-alkylthiols (C1) and, in particular, hexadecane thiol, are capable of attracting compounds (S) bearing hydrocarbon groups, e.g. aromatic rings or alkyl chains.

According to the invention, the organic semiconductor compound (S) is employed in the form of crystallites. For the purpose of the invention, the term "crystallite" refers to small single crystals with maximum dimensions of 5 millimeters. Exemplary crystallites have maximum dimensions of 1 mm or less and preferably have smaller dimensions (frequently less than 500 µm, in particular less than 200 µm, for example in the range of 0.01 to 150 µm, preferably in the range of 0.05 to 100 µm), so that such crystallites can form fine patterns on the substrate. Here, an individual crystallite has a single crystalline domain, but the domains may include one or more cracks, provided that the cracks do not separate the crystallite into more than one crystalline domain. The stated particle sizes and the christallographic properties of the crystallites can be determined by direct X-ray analysis.

The particles of the semiconductor compound (S) may be of regular or irregular shape. For example, the particles can be present in spherical or virtually spherical form or in the form of needles.

Preferably the organic semiconductor (S) is employed in the form of particles with a length/width ratio (L/W) of at least 1.05, more preferably of at least 1.5, especially of at least 3.

In an organic field effect transistor (OFET), a channel made of a single organic semiconductor crystal will typically have greater mobility than a channel made of a polycrystalline organic semiconductor. The high mobility results from the fact that the single crystal channel does not have grain boundaries. Grain boundaries lower the conductivities and mobilities of OFET channels made of polycrystalline organic semiconductor films.

Organic semiconductor crystallites, e.g. with diameters of about 1 to 10 microns or more, are readily available. Such organic semiconductor crystallites can be fabricated by methods described by R. A. Laudise et al in "Physical vapor growth of organic semiconductors" Journal of Crystal Growth 187 (1998) pages 449-454 and in "Physical vapor growth of centimeter-sized crystals of α-hexathiophene" Journal of Crystal Growth 182 (1997) pages 416-427. Both of these articles by Laudise et al are incorporated herein in their entirety by reference. The methods described by Laudise et al include passing an inert gas over an organic semiconductor substrate that is maintained at a temperature high enough that the organic semiconductor evaporates. The methods described by Laudise et al also include cooling down the gas saturated with organic semiconductor to cause an organic semiconductor crystallite to condense spontaneously. Such organic semiconductor crystallites are also commercially available. For example, BASF Corporation of 3000 Continental Drive-North, Mount Olive, N.J. 07828-1234, sells pigment crystallites that are organic semiconductors. One such crystallite is formed of copper phthalocyanine. The ready availability of organic semiconductor crystallites enables the construction of OFETs with high quality channels.

In step a) of the process according to the invention, a stamp, having a surface including a plurality of indentations defining an indentation pattern formed therein, said indentations being contiguous with a stamping surface and defining a stamping pattern, is provided.

Stamps useful in the present invention are known in the art and are commercially available. Generally, these stamps can be produced by casting a polymeric material onto a mold having the desired pattern. The particular material chosen for formation of the stamp is not critical to the present invention, but should satisfy certain physical characteristics. In a preferred embodiment, the stamp is elastomeric. Polymeric materials suitable for use in fabrication of the stamp may have linear or branched backbones, and may be crosslinked or noncrosslinked, depending upon the particular polymer and the degree of formability desired of the stamp. A variety of elastomeric polymeric materials are suitable for such fabrication, especially polymers of the general classes of silicone polymers, epoxy polymers, and acrylate polymers. Examples of silicone elastomers suitable for use as stamps include those formed from precursors including the chlorosilanes such as methylchlorosilanes, ethylchlorosilanes, and phenylchlorosilanes, and the like. A particularly preferred silicone elastomer is polydimethylsiloxane (PDMS). Exemplary silicone polymers include those sold under the trademark RTV by GE Advanced Materials and under the trademark Sylgard by the Dow Chemical Company, Midland, Mich., and particularly Sylgard 182, Sylgard 184, and Sylgard 186.

The stamp includes a stamping surface having a variety of features defined thereon by indentations. The form and dimensions of the indentations depend on the nature of the electronic devices to be formed on the substrate (e.g. molecular-sized transistors, connecting wires, etc.). Accordingly, the stamping surface may include features having a variety of lateral dimensions. Different patterns on the substrate can be obtained by the process of the invention. The elevations of the stamp defining the stamping pattern can have the same or different forms. Preferably the indentations are uniform and are e.g. in the form of a polygon, having 3, 4, 5, 6, 7, 8, 9, 10, 11 or 12 corners. Preferably, the indentations are rectangular, ellipsoidal or circular. Each indentation can have a minimum dimension of at least 50 nm, preferably at least 100 nm, more preferably at least 500 nm. Each indentation can have a maximum dimension of up to 5 mm, preferably of up to 1 mm, more preferably of up to 500 µm. Typical indentations are in the form of 10 µm-100 µm squares, 5-100 µm lines, and 10-100 µm dots. The distance between two adjacent indentations is preferably at least 50 nm, more preferably at least 100 nm, especially at least 500 nm.

A suitable method for forming the stamp is a photolytic method. For example, a mask may be positioned between the surface of the stamp and a source of irradiation, and the surface is irradiated through the mask for a predetermined period of time. Portions of the surface may be degraded by such irradiation, forming indentations in the surface upon removal of such degraded portions. According to this method, a variety of patterns may be very conveniently formed in a stamp according to a variety of available masks. In addition, the photolytic method may be used in combination with the above-described methods involving hardening a hardenable fluid on a mold surface. For example, a hardenable fluid may be contacted with a mold surface and allowed to harden to form the stamp having a predetermined stamping surface. In addition, the predetermined stamping surface may be irradiated through a mask to create additional features in the stamping surface. According to this method, a photoresist may be used as the stamp material itself. Particular types of polymers that may be patterned using the above-described photolytic method, preferred wavelengths for photopatterning, and lengths of time of photolysis are known in the art.

The surface of the mold serving as the master for the stamp may comprise any morphological features that may desirably serve as a template for the formation of the stamp for the patterning of a semiconductor on the surface of a substrate. For example, a microeletronic device such as an IC may serve as a template. The mold surface may be formed according to a variety of ways. According to one, the mold surface is micromachined from a material such as metal. According to another, the mold surface is formed lithographically by providing a substrate, depositing a film of material onto the substrate, coating an exposed surface of the material with resist, irradiating the resist according to a predetermined pattern, removing irradiated portions of the resist from the material surface, contacting the material surface with a reactant selected to react chemically therewith and selected to be chemically inert with respect to the resist such that portions of the material according to the predetermined pattern are degraded, removing the degraded portions, and removing the resist to uncover portions of the material formed according to the predetermined pattern to form the mold surface. According to another method for forming the mold surface, a substrate may be provided, and coated with resist. Subsequently, portions of the resist may be irradiated according to a particular predetermined pattern. Irradiated portions of the resist may then be removed from the substrate to expose portions of the substrate surface according to the predetermined pattern, and the substrate may be contacted with a plating reagent such that exposed portions according to the predetermined pattern are plated. Then, the resist may be removed to uncover portions of the exposed substrate according to the predetermined pattern bordered by plated portions of the substrate to form the mold surface.

In step b) of the process according to the invention, the stamping surface is coated with at least one compound (C1) or (C2) (i.e. the stamped being "inked" with at least one compound C1 or C2). The stamp may be inked with a solution comprising the compounds (C1) or (C2) that will be adsorbed to the stamp. Accordingly, the inking may, e.g. be accomplished by: contacting the stamp with a material (i. e., paper, sponge) moistened with the ink, pouring the ink directly onto the stamp, applying the ink to the stamp with an appropriate application device (e. g. a cotton swab, brush, sprayer, syringe, etc.), or dipping the stamp surface into a solution comprising (C1) or (C2). The compound may be allowed to dry on the stamp or may be blown dry.

In step c) of the process according to the invention, at least a portion of the surface of the substrate is contacted with the stamping surface to allow deposition of the compound (C1) or (C2) on the substrate.

The inked stamp is then placed into contact with the functionalized polymer surface for a length of time sufficient for the compound (C1) or (C2) to be transferred to the surface of the substrate. The period of time required for the stamping process will of course vary with the compounds (C1) and (C2), material of the stamp and substrate being used. A person skilled in the art will be able to determine a suitable amount of time. For example, contacting the stamping surface with the surface of the substrate for a period of time in the range of approximately 1 second to 5 minutes (e.g. 5 to 60 seconds) is generally adequate to effect sufficient transfer, but contact may be maintained for longer or shorter periods of time if necessary or appropriate.

In step d) of the process according to the invention, the stamping surface is removed to provide a pattern of binding sites on the surface of the substrate. These binding sites are capable of binding crystallites of the organic semiconductor compound (S) by the aforementioned mechanisms.

In one embodiment of the present invention, the substrate may be stamped more than once, e.g. to produce different types of binding sites on the surface of the substrate. The presence of different species of binding sites can be useful for the construction of complex circuits. For example, the different species of binding sites can be modified with different compounds (C1); thus, different semiconductors (S) can be bound to the substrate.

The substrate with the pattern of binding sites thereon, obtained in step d) by the method according to the first embodiment of the invention, can optionally be contacted with at least one compound (C2) as defined above. The compounds (C2) are usually employed to cover those areas of the substrate that bear no binding sites. As the compounds (C2) usually show a repulsive interaction with the binding sites formed by compounds (C1) and are not capable of replacing or covering the binding sites, they can be applied by contacting the surface of the substrate with a solution of at least one compound (C2) in a suitable solvent. After a span of time sufficient to bind (C2) to the surface of the substrate, the solution is preferably removed from the substrate by rinsing with a solvent. Of course, defined areas of the substrate can also be patterned with at least one compound (C2) using the pattern technique according to the invention.

The substrate with a pattern of sites on the surface that prevent binding of a crystalline compound, obtained in step d) by the method according to the second embodiment of the invention, can optionally be contacted with at least one compound (C1) to allow deposition of the crystalline compound on areas of the substrate not patterned with compound (C2). As mentioned before, the compounds (C2) usually show a repulsive interaction with the compounds (C1) and the compounds (C1) are usually not capable of replacing or covering sites already covered with (C2). Therefore, (C1) can usually be applied to those substrates by contacting the surface of the substrate with a solution of at least one compound (C1) in a suitable solvent. After a span of time sufficient to bind (C1) to the surface of the substrate, the solution is preferably removed from the substrate by rinsing with a solvent. Of course, defined areas of the substrate can also be patterned with at least one compound (C1) by using the pattern technique for application of (C2).

Preferably, a suspension of solid semiconductor particles in a liquid medium is used for applying a plurality of crystallites of the organic semiconductor compound (S) to the surface of the substrate in step e).

Preferably, the semiconductor compound (S) has a solubility in the liquid medium of not more than 10 g/l, more preferably of not more than 5 g/l, especially of not more than 1 g/l at 25° C./1013 mbar.

The liquid medium is preferably selected from water and mixtures of water and at least one water-miscible organic solvent. Mixtures of water and at least one water water-miscible organic solvent preferably contain not more than 20 % by weight of organic solvents. Suitable water-miscible organic solvents are $C_3$-$C_4$-ketones such as acetone und methylethylketone, cyclic ethers such as dioxane and tetrahydrofurane, $C_1$-$C_4$-alkanoles such as methanol, ethanol, n-propanol, isopropanol, n-butanol, tert.-butanol, polyoles and mono- und dimethylether thereof, such as Glycole, propanediol, ethylene-glycolmonomethylether, diethyleneglycol, Diethyleneglycolmonomethylether, diethyle-neglycoldimethylether, glycerol, $C_2$-$C_3$-nitriles, like acetonitrile und propionitrile, di-methylsulfoxide, dimethylformamide, formamide, acetamide, dimethylacetamide, buty-rolacton, 2-pyrrolidone und N-methylpyrrolidone. Preferred as the liquid medium are mixtures of water and at least one C1-$C_4$-alkanol.

The suspension of the semiconductor particles used in step e) may comprise at least one surfactant to stabilize the semiconductor particles. The surfactant is preferably a nonionic surfactant. However, ionic surfactants, e.g. anionic emulsifiers, anionic protective colloids, cationic emulsifiers, cationic protective colloids and zwitterionic (betainic) emulsifiers are also suitable. In a preferred embodiment, no surfactants are employed.

The solids content of the suspension is generally in the range of 0.001 to 20% by weight and in particular in the range of 0.1 to 10% by weight.

For the application of the crystallites of the organic semiconductor compound to the substrate, solution-based techniques such as pipetting, spin- or immersion-coating, i.e., dip-coating, can be used. In the case of pipetting, a suspension of the semiconductor crystallites is added dropwise to the patterned substrate. In the case of spin-coating, the patterned substrate is flooded with a suspension of the semiconductor crystallites and then spun to bring the substrate in intimate contact with the suspension. In the case of immersion-coating (dip-coating), the patterned substrate is immersed in a suspension containing the semiconductor crystallites, preferably under agitation of the suspension, and then withdrawn from the suspension. In all of these cases, the liquid medium is preferably removed from the substrate after the application by rinsing with a solvent. Preferably, the solvent corresponds to the liquid medium of the suspension used for application of the crystallites. Afterwards, the solvent is removed, typically by spontaneous evaporation. The rate of evaporation can be accelerated by means of one or more methods known in the art such as heat, reduced pressure, ventilation, and the like.

The invention will now be described in more detail on the basis of the accompanying figures and the following examples.

EXAMPLES

General Procedure:

Pigment single crystals could be dispersed in water by slight shaking. Substrates with hydrophilic/hydrophobic regions could be patterned through the following microcontact printing process: A PDMS stamp with different patterns was made by pouring PDMS precursors and cross-linkers (weight ratio around 10:1, Silguard 184 from Dow Chemical) against Si master and curing them at 65° C. for 8 hours. The obtained PDMS stamp was then inked with a substance (C1) by swiping several mM solutions (e. g. thiol or silane) with a Q-tip and then drying by air-flow. The substrate surface could be patterned by contacting with a PDMS stamp for around 20 seconds, and then rinsing with solvent and drying in air. The regions that were not contacted with the stamp could be optionally backfilled by soaking in 1 mM solutions of different molecules (C2) for around 30 min, followed by rinsing with solvent and drying in air. Crystals of semiconductor compounds (S) could be patterned onto substrates from crystal suspensions through pipetting, dip-coating or spin-coating.

Example 1

Copper phthalocyanine (CuPc) crystals were applied to an Au substrate (100 μm×100 μm squares) patterned with hexadecane thiol from a suspension having a crystal concentration of 2 mg/ml using water as the suspension medium. The crystals were applied by pipetting and the patterning time was 10 min. The resulting pattern is shown in FIG. 1.

Example 2

Figure 2:
FIG. 2 shows CuPc crystals on an Au substrate; crystals are applied using water/methanol as the suspension medium.

Copper phthalocyanine (CuPc) crystals were applied to an Au substrate (100 μm×100 μm squares) patterned with hexadecane thiol from a suspension having a crystal concentration of 2 mg/ml using a 3:1 mixture of water:methanol as the suspension medium. The crystals were applied by pipetting and the patterning time was 20 min. The resulting pattern is shown in FIG. 2.

Example 3

Figure 3:
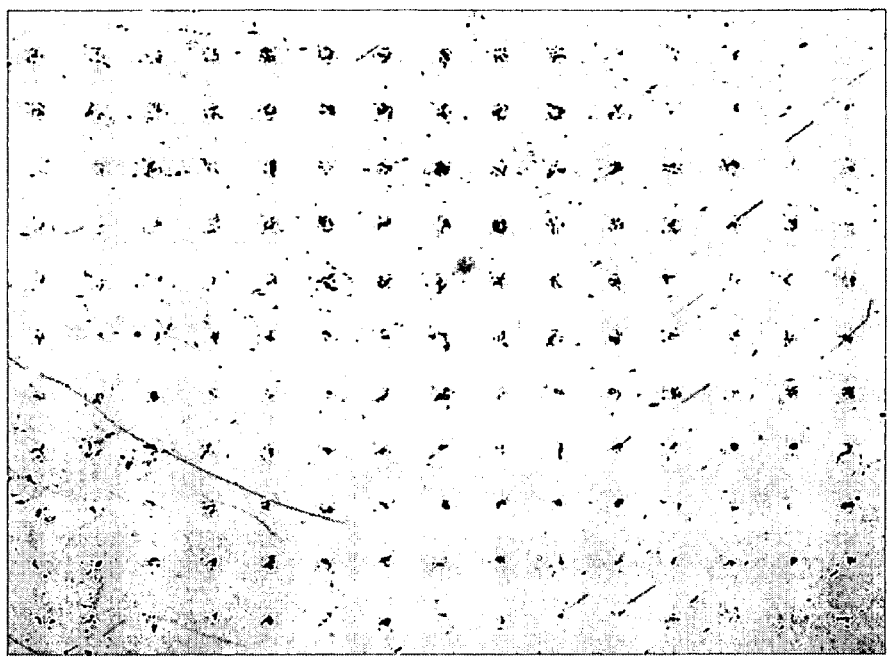
FIG. 3 shows CuPc crystals on an Au substrate; crystals are applied by spin-coating.

Copper phthalocyanine (CuPc) crystals were applied to an Au substrate (100 μm×100 μm squares) patterned with hexadecane thiol from a suspension having a crystal concentration of 10 mg/ml using water as the suspension medium. The crystals were applied by spin-coating at 500 rpm (3 s) and then 2000 rpm (20 s). The resulting pattern is shown in FIG. 3.

Example 4

Figure 4:
FIG. 4 shows CuPc crystals on an Au substrate; crystals are applied by pipetting.

Copper phthalocyanine (CuPc) crystals were applied to an Au substrate (100 μm×100 μm squares) patterned with hexadecane thiol from a suspension having a lower crystal concentration of 0.2 mg/ml using water as the suspension medium. The crystals were applied by pipetting and the patterning time was 20 min. The resulting pattern is shown in FIG. 4.

Example 5

Figure 5:
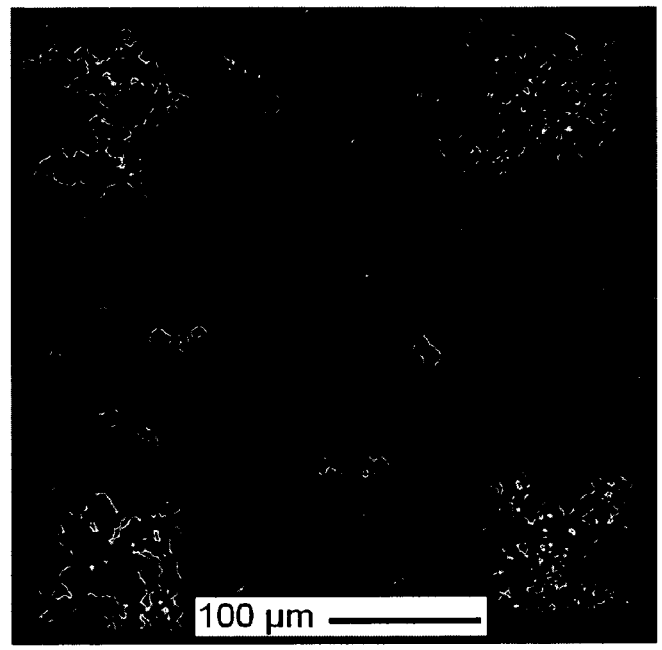
FIG. 5 shows Rubrene (2-10 μm) single crystals on an Au substrate; crystals are applied using water as the suspension medium.

Rubrene crystals were applied to an Au substrate patterned with hexadecane thiol (100 μm×100 μm squares) from a suspension of crystals. The crystals were applied by pipetting and the patterning time was 10 min. The resulting pattern is shown in FIG. 5.

Example 6

Figure 6:
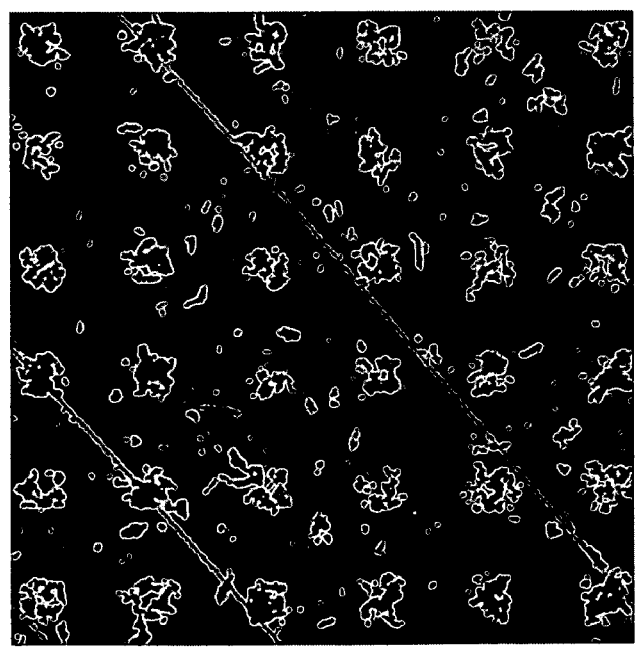
FIG. 6 shows CuPc crystals on an $NH_3^+Cl^-$ substrate, patterned with hexadecane thiol.

CuPc crystals were applied to an $NH_3^+Cl^-$ substrate (100 μm×100 μm squares) patterned with hexdecane thiol from a suspension having a crystal concentration of 2mg/ml using water as the suspension medium. The crystals were applied by pipetting and the patterning time was 5 min. The resulting pattern is shown in FIG. 6.

Example 7

Application of crystals on substrates with different kind of patterns

Figure 7A:
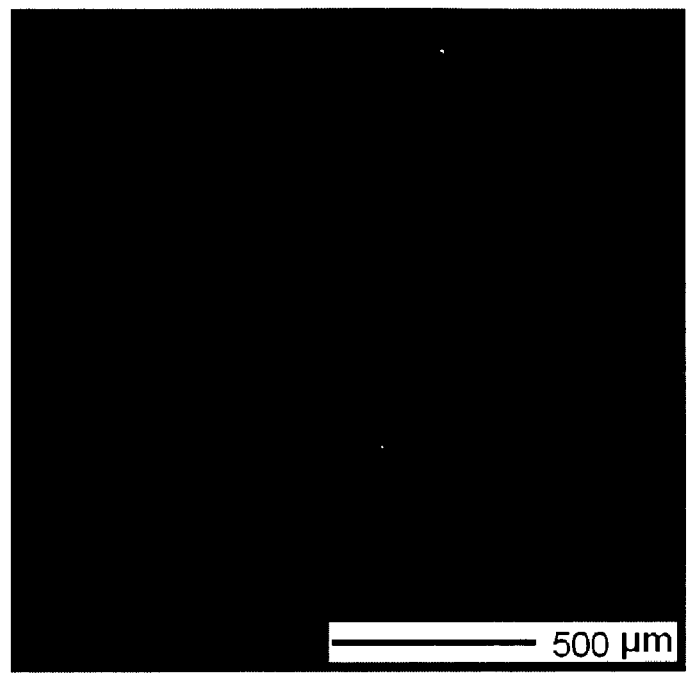
FIG. 7a and FIG. 7b show CuPc crystals on substrates with different kind of patterns.
Figure 7B:
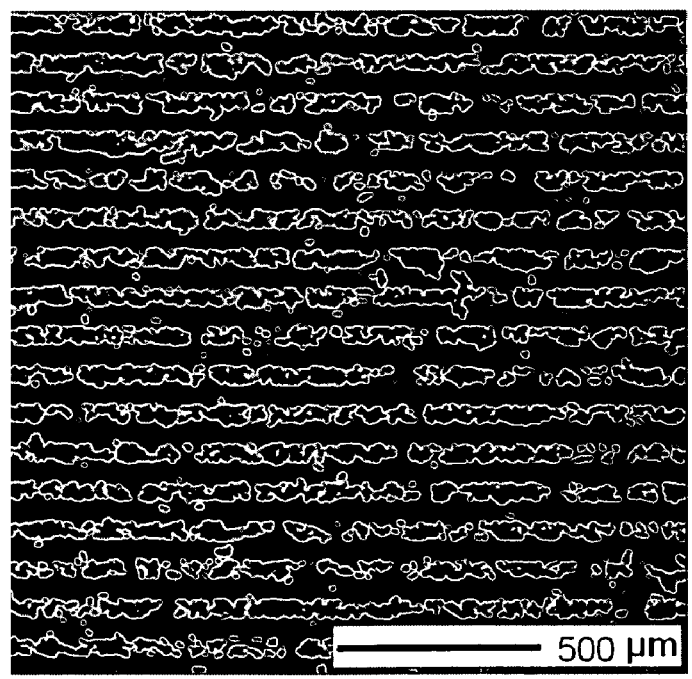
Figure 8:
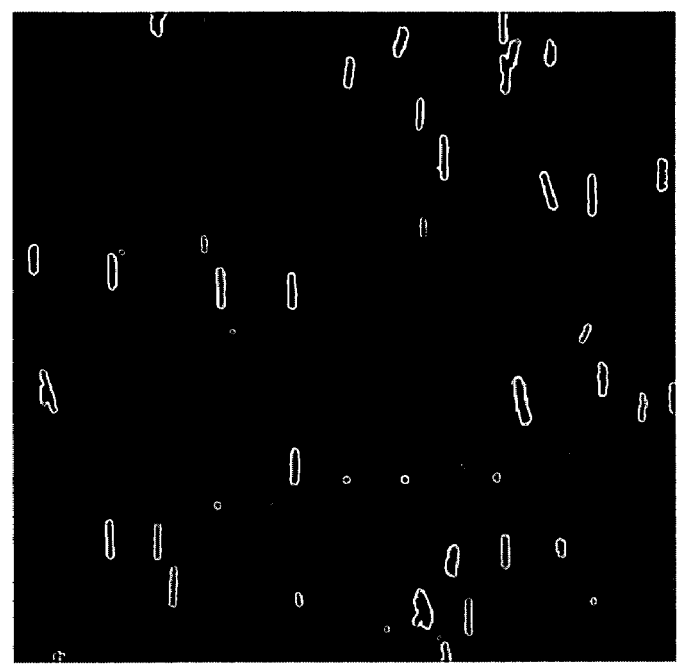
FIG. 8 shows needle-like CuPc crystals on an Au substrate, patterned with hexadecane thiol and sodium salt of 3-mercapto-1-propanesulfonic acid.

CuPc crystals were applied to an Au substrate with 50 μm stripes of unmodified Au and 50 μm stripes patterned with hexadecane thiol (Crystal concentration: 2 mg/ml; solvent:

water; patterning time: 20 min). FIG. 7a shows an Au substrate after etching of the exposed Au with hexadecane thiol. FIG. 7b shows CuPc crystals patterned onto the substrate shown in FIG. 7a.

Example 8

Crystal Alignment

A gold substrate was patterned with the sodium salt of 3-mercapto-1-propanesulfonic acid to designe hydrophilic/hydrophobic lines on the substrate surface Needle-like CuPc crystals having a maximum dimension between 50 µm and 106 µm could be aligned onto the substrates with 20 µm $SO^{3-}Na^+$/20 µm HDT patterns by water flow. The crystals are bound to the areas modified with sodium salt of 3-mercapto-1-propanesulfonic acid. In this example, the flow direction of the crystal suspension was parallel to surface stripes. It is also possible to align crystals into the hydrophilic regions of a substrate without control of the flow direction, although the best results are obtained if the flow direction is controlled.

Example 9

Production of an Organic Field Effect Transistor

Figure 9A:
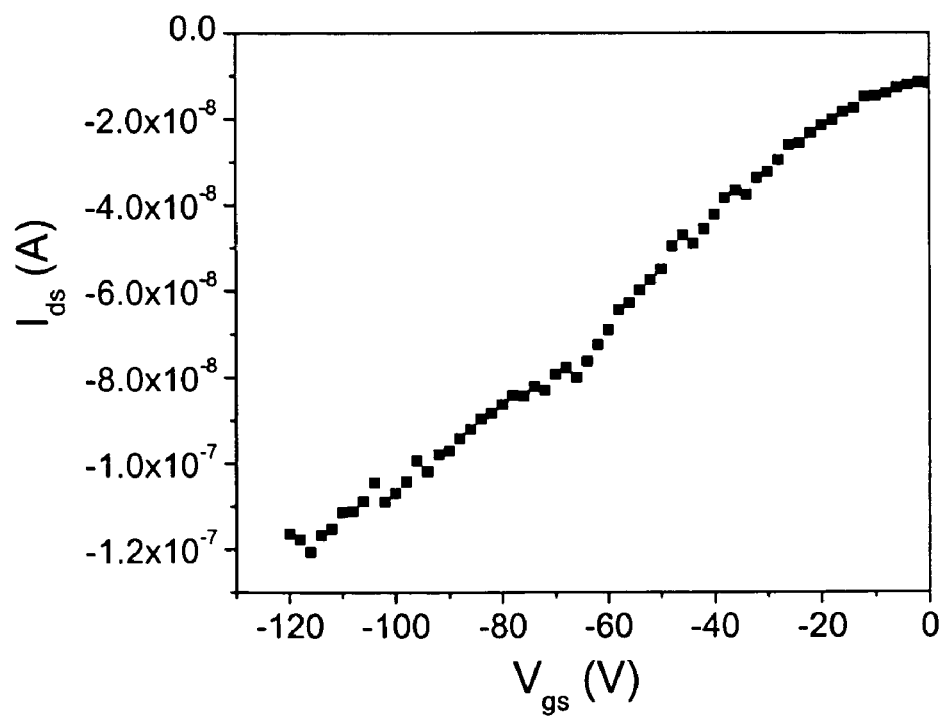
FIG. 9a and FIG. 9b show the transistor performance of an OFET obtained by self-assembly of (bis(t-butyl) phenyl bithiophene phenyl) crystals.
Figure 9B:
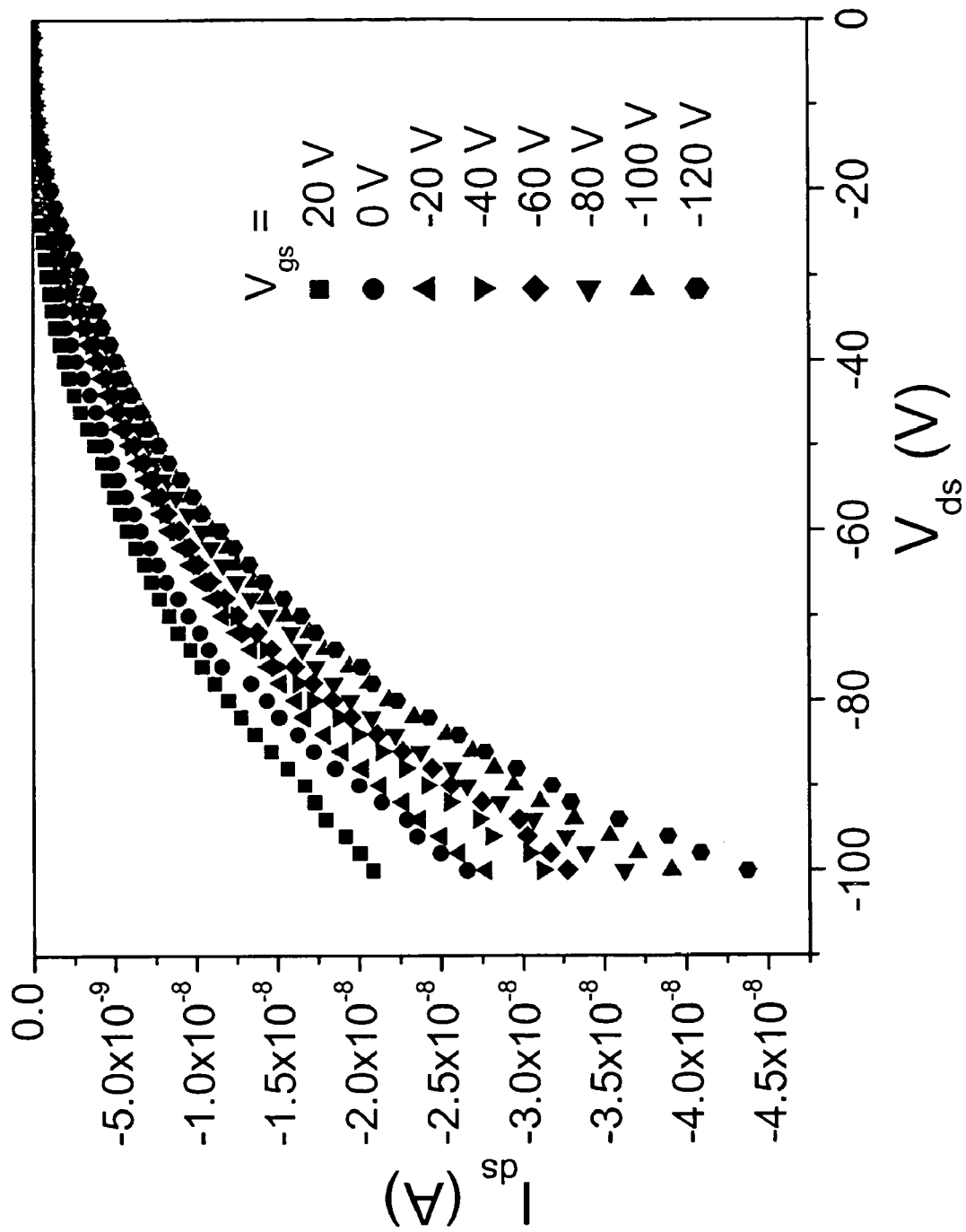
Figure 10A:
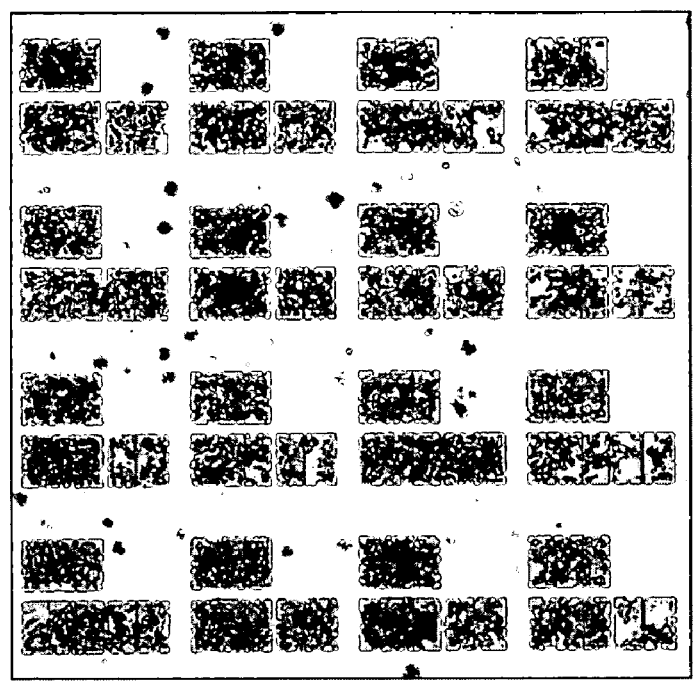
FIG. 10a and FIG. 10b show the patterned crystals of an OFET obtained by self-assembly of (bis(t-butyl) phenyl bithiophene phenyl) crystals.
Figure 10B:
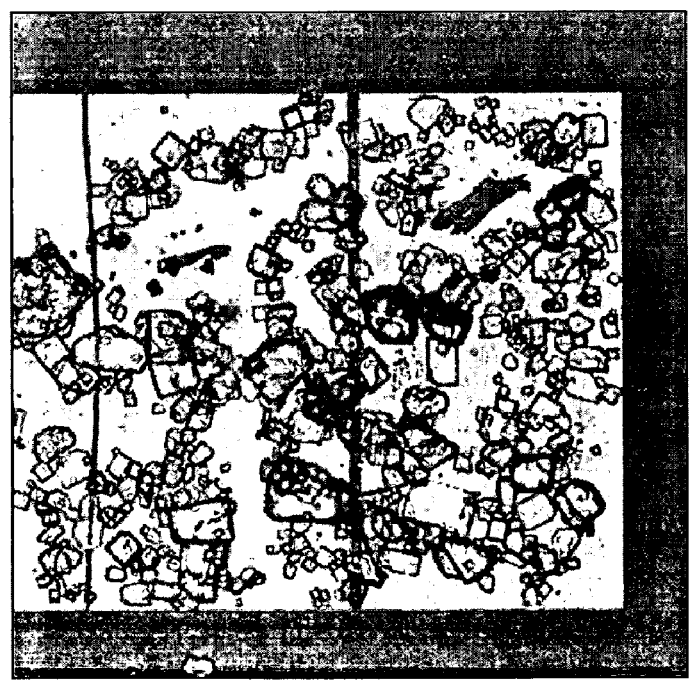

A substrate was prepared, using highly doped Si as the gate electrode and thermally grown silicon dioxide (300 nm) as dielectric layer. Au contact pads with 4 ψm channel length were lithographically patterned on the substrate. The substrates were first treated with UV/ozone for 30 min, and then soaked in 1 mM n-(octadecyl)trichlorosilane solution for 15 min using toluene as solvent. After being rinsed with toluene, the substrates were subsequently baked on hotplate at 100° C. for 2 min. Then the substrates were soaked in a 1 mM solution of 3-mercapto-1-propanesulfonic acid (sodium salt) in ethanol for 20 min, and then rinsed with ethanol for several times. For the production of an OFET by self-assembly tPTTPt (bis(t-butyl) phenyl bithiophene phenyl) crystals were applied to the substrate from a suspension having a crystal concentration of 2 mg/ml using water as the suspension medium. The crystals were applied by pipetting and the patterning time was 20 min. The characteristic curves of the obtained transistor are shown in FIGS. 9a and 9b. The resulting pattern is shown in FIGS. 10a and 10b.

Figure 11:
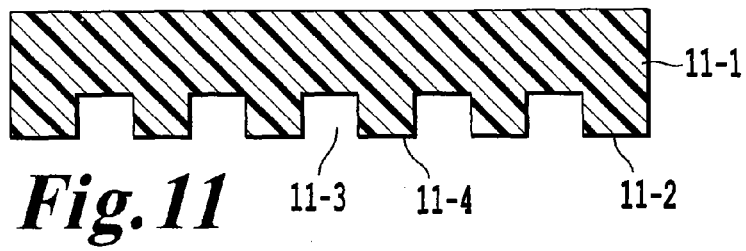
FIG. 11 shows a stamp having a surface with a plurality of indentations forming a pattern on a surface of the stamp.

FIG. 11 shows a stamp (11-1) that has a surface (11-2) with a plurality of indentations (11-3) formed on the surface thereby providing an indentation pattern (11-4). The indentation pattern (11-4) forms a stamping pattern on a surface (11-12) of the stamp (11-1).

Figure 12A:
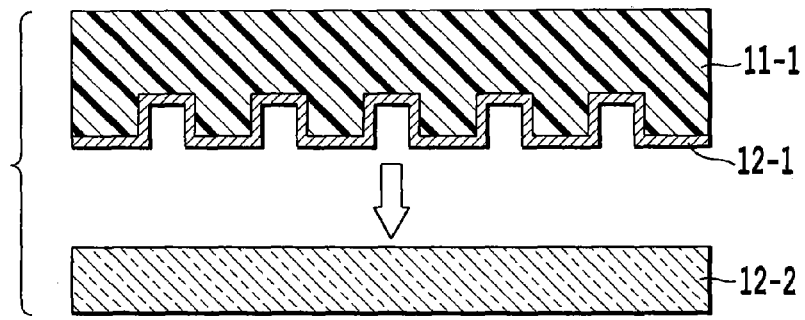
FIG. 12A shows a stamp having a surface with a plurality of indications forming a pattern coated with a compound capable of binding a crystalline compound undergoing contacting with a substrate.
Figure 12B:
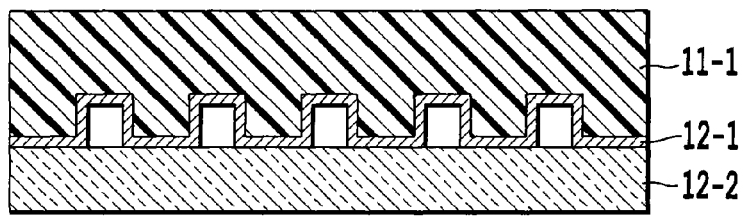
FIG. 12B shows a stamp coated with a compound capable of binding to the surface of a substrate in contact with a substrate.
Figure 12C:
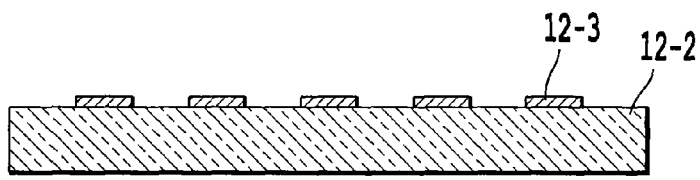
FIG. 12C shows a substrate removed from a stamp after the substrate has been contacted with a stamp coated with a compound of binding a crystalline compound.
Figure 12D:
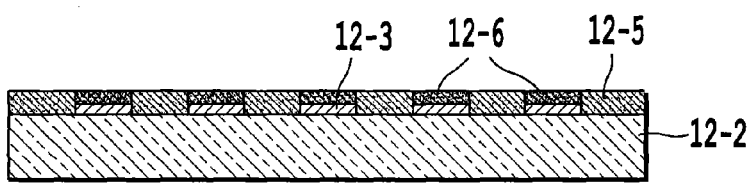
FIG. 12D shows a substrate after contacting with a stamp having a coating capable of binding with a crystalline compound where the substrate includes a pattern of the compound on a surface of the substrate and the pattern and the substrate is in contact with a suspension comprising crystals of a crystalline compound.

FIG. 12A-D show a process whereby a stamp (11-1) having a surface (11-2) with a plurality of indentations (11-3) forming a pattern (11-4) is coated with a compound capable of binding to the surface of the substrate and of binding at least one crystalline compound (12-1) which is used to form a substrate having a pattern that binds a liquid medium containing a crystalline compound (12-6). In FIG. 12A the stamp (11-1) with the surface (11-2) is coated with the compound which is capable of binding a surface of the substrate and also binding at least one crystalline compound (12-1) undergoing contacting with a substrate (12-2). FIG. 12B shows the composite of the stamp and the substrate formed by the contacting where the compound capable of binding at least one crystalline substance is present (12-1) on the stamp and on the substrate (12-2). FIG. 12C shows the substrate after the stamp has been removed. FIG. 12C shows a pattern of binding sites (12-3) on the surface of the substrate (12-2). FIG. 12D shows the substrate (12-2) having a pattern of binding sites (12-3) which is coated with a suspension comprising crystals of a crystalline compound and a liquid medium (12-5). At least a portion of the crystals in the suspension (12-5) are bound to the pattern of binding sites (12-6).

What is claimed is:

1. A method of patterning the surface of a substrate with at least one crystalline compound, comprising the steps of:
    (a) providing a stamp having a surface including a plurality of indentations formed therein defining an indentation pattern, said indentations being contiguous with a stamping surface and defining a stamping pattern,
    (b) coating said stamping surface with at least one compound (C1) capable of binding to the surface of the substrate and of binding at least one crystalline compound,
    (c) contacting at least a portion of the surface of a substrate with said stamping surface to allow deposition of said compound (C1) on the substrate,
    (d) removing said stamping surface to provide a pattern of binding sites on the surface of the substrate,
    (e) depositing a suspension comprising crystals of a crystalline compound and a liquid medium onto the surface of the substrate to enable at least a portion of the crystals to bind to at least a portion of the binding sites on the surface of the substrate.

2. The method as claimed in claim 1, wherein the crystalline compound consists of a plurality of crystallites of at least one organic semiconducting compound (S).

3. The method as claimed in claim 2, wherein the organic semiconductor (S) is employed in the form of particles having a maximum dimension of 5 millimeters or less.

4. The method as claimed in claim 2, wherein the organic semiconductor (S) is employed in the form of particles with a length/width ratio of at least 1.05.

5. The method as claimed in claim 2, wherein the organic semiconductor (S) is employed in the form of particles having a maximum dimension of 1 mm or less.

6. The method as claimed in claim 2, wherein the organic semiconductor (S) is employed in the form of particles having a maximum dimension of 500 µm or less.

7. The method as claimed in claim 2, wherein the organic semiconductor (S) is employed in the form of particles with a length/width ratio of at least 1.5.

8. The method as claimed in claim 2, wherein the organic semiconductor (S) is employed in the form of particles with a length/width ratio of at least 3.

9. The method as claimed in claim 1, wherein the substrate with the pattern of binding sites obtained in step d) is contacted with at least one compound (C2) to prevent deposition of the crystalline compound on areas of the substrate not patterned with compound (C1).

10. The method of claim 9, wherein the compound (C2) comprises hydrocarbon groups.

11. The method of claim 9, wherein the compound (C2) comprises fluorinated hydrocarbon groups.

12. The method as claimed in claim 1, wherein a suspension of solid semiconductor particles in a liquid medium is used for the application of the crystallites of the organic semiconductor (S) to the surface of the substrate in step e).

13. The method as claimed in claim 12, wherein the semiconductor has a solubility in the liquid medium of not more than 10g/l at 25° C./1013 mbar.

14. The method as claimed in claim 13, wherein liquid medium is selected from the group consisting of water and mixtures of water and at least one water-miscible organic solvent.

15. The method as claimed in claim 1, wherein the application of the crystalline compound in step e) is effected by pipetting, dip-coating or spin-coating.

16. The method as claimed in claim 1, wherein at least 90% by weight of the crystalline compound bound to the surface of the substrate is bound to surface areas patterned with (C1).

17. The method as claimed in claim 1, wherein at least 95% by weight of the crystalline compound bound to the surface of the substrate is bound to surface areas patterned with (C1).

18. The method as claimed in claim 1, wherein at least 99% by weight of the crystalline compound bound to the surface of the substrate is bound to surface areas patterned with (C).

19. The method of claim 1, further comprising:
after (e), removing the liquid medium from the substrate in the liquid phase.

20. A method of patterning the surface of a substrate with at least one crystalline compound, comprising the steps of:
(a) providing a stamp having a surface including a plurality of indentations formed therein defining an indentation pattern, said indentations being contiguous with a stamping surface and defining a stamping pattern,
(b) coating said stamping surface with at least one compound (C2) capable of binding to the surface of the substrate and to prevent binding of a crystalline compound,
(c) contacting at least a portion of the surface of a substrate with said stamping surface to allow deposition of said compound (C2) on the substrate,
(d) removing said stamping surface to provide a pattern of sites on the surface of the substrate that prevent binding of a crystalline compound,
(e) depositing a suspension comprising crystals of a crystalline compound and a liquid medium onto the surface of the substrate to enable at least a portion of the crystals to bind to at least a portion of the surface of the substrate not covered with (C2).

21. The method as claimed in claim 20, wherein the substrate obtained in step d) with a pattern of sites on the surface that prevent binding of a crystalline compound is contacted with at least one compound (C1) to allow deposition of the crystalline compound on areas of the substrate not patterned with compound (C2).

22. The method as claimed in claim 20, wherein at least 90% by weight of the crystalline compound bound to the surface of the substrate is bound to surface areas not patterned with (C2).

23. The method as claimed in claim 20, wherein the crystalline compound consists of a plurality of crystallites of at least one organic semiconducting compound (S).

24. The method as claimed in claim 23, wherein the organic semiconductor (S) is employed in the form of particles having a maximum dimension of 5 millimeters or less.

25. The method as claimed in claim 23, wherein the organic semiconductor (S) is employed in the form of particles with a length/width ratio of at least 1.05.

26. The method as claimed in claim 23, wherein the organic semiconductor (S) is employed in the form of particles having a maximum dimension of 1 mm or less.

27. The method as claimed in claim 23, wherein the organic semiconductor (S) is employed in the form of particles having a maximum dimension of 500 µm or less.

28. The method as claimed in claim 23, wherein the organic semiconductor (S) is employed in the form of particles with a length/width ratio of at least 1.5.

29. The method as claimed in claim 23, wherein the organic semiconductor (S) is employed in the form of particles with a length/width ratio of at least 3.

30. The method as claimed in claim 20, wherein a suspension of solid semiconductor particles in a liquid medium is used for the application of the crystallites of the organic semiconductor (S) to the surface of the substrate in step e).

31. The method as claimed in claim 30, wherein the semiconductor has a solubility in the liquid medium of not more than 10 g/l at 25° C./1013 mbar.

32. The method as claimed in claim 31, wherein liquid medium is selected from the group consisting of water and mixtures of water and at least one water-miscible organic solvent.

33. The method as claimed in claim 20, wherein the application of the crystalline compound in step e) is effected by pipetting, dip-coating or spin-coating.

34. The method as claimed in claim 20, wherein at least 95% by weight of the crystalline compound bound to the surface of the substrate is bound to surface areas not patterned with (C2).

35. The method as claimed in claim 20, wherein at least 99% by weight of the crystalline compound bound to the surface of the substrate is bound to surface areas not patterned with (C2).

36. The method of claim 20, further comprising:
after (e), removing the liquid medium from the substrate in the liquid phase.

37. A method for producing a substrate comprising a pattern of organic field effect transistors, each transistor comprising:
a crystallite of an organic semiconductor (S) located on the substrate;
a gate structure positioned to control a conductivity of a channel portion of the crystallite; and
conductive source and drain electrodes located at opposite ends of the channel portion,
wherein the method comprises:
positioning the crystallites by:
(a) providing a stamp having a surface including a plurality of indentations formed therein defining an indentation pattern, said indentations being contiguous with a stamping surface and defining a stamping pattern,
(b) coating said stamping surface with at least one compound (C1) capable of binding to the surface of the substrate and also capable of binding at least one organic semiconducting compound (S),
(c) contacting at least a portion of the surface of a substrate with said stamping surface to allow deposition of said compound (C1) on the substrate,
(d) removing said stamping surface to provide a pattern of binding sites on the surface of the substrate,
(e) applying a plurality of crystallites of the organic semiconducting compound (S) to the surface of the substrate to enable at least a portion of the applied crystallites to bind to at least a portion of the binding sites on the surface of the substrate.

38. The method as claimed in claim 37, wherein the pattern of organic field effect transistors comprises gate structures that include a gate electrode located on the substrate.

39. The method as claimed in claim 37, wherein the pattern of organic field effect transistors comprises conductive source electrodes and/or drain electrodes located on the substrate.

40. The method of claim 37, wherein the applying (e) comprises:
depositing a suspension comprising crystals of the crystalline compound and a liquid medium onto the surface of the substrate, and after (e)

removing the liquid medium from the substrate in the liquid phase.

41. A method for producing a substrate comprising a pattern of organic field effect transistors, each transistor comprising:

- a crystallite of an organic semiconductor (S) located on the substrate;
- a gate structure positioned to control a conductivity of a channel portion of the crystallite; and
- conductive source and drain electrodes located at opposite ends of the channel portion,
- wherein the method comprises:
- positioning the crystallites by:
  - (a) providing a stamp having a surface including a plurality of indentations formed therein defining an indentation pattern, said indentations being contiguous with a stamping surface and defining a stamping pattern,
  - (b) coating said stamping surface with at least one compound (C2) capable of binding to the surface of the substrate and to prevent binding of at least one organic semiconducting compound (S),
  - (c) contacting at least a portion of the surface of a substrate with said stamping surface to allow deposition of said compound (C2) on the substrate,
  - (d) removing said stamping surface to provide a pattern of sites on the surface of the substrate that prevent binding of a crystalline compound,
  - (e) applying a plurality of crystallites of the organic semiconducting compound (S) to the surface of the substrate to enable at least a portion of the applied crystallites to bind to at least a portion of the surface of the substrate not covered with (C2).

42. The method as claimed in claim 41, wherein the pattern of organic field effect transistors comprises gate structures that include a gate electrode located in the substrate.

43. The method as claimed in claim 41, wherein the pattern of organic field effect transistors comprises conductive source electrodes and/or drain electrodes located on the substrate.

44. The method of claim 41, wherein the applying (e) comprises:

- depositing a suspension comprising crystals of the crystalline compound and a liquid medium onto the surface of the substrate, and after (e)
- removing the liquid medium from the substrate in the liquid phase.

* * * * *